(12) United States Patent  
Habel et al.

(10) Patent No.: US 7,944,237 B2  
(45) Date of Patent: May 17, 2011

(54) ADJUSTABLE HOLD FLIP FLOP AND METHOD FOR ADJUSTING HOLD REQUIREMENTS

(75) Inventors: Stephan Habel, Berg (DE); Stefan G. Block, Munich (DE)

(73) Assignee: LSI Corporation, Milpitas, CA (US)

( * ) Notice: Subject to any disclaimer, the term of this patent is extended or adjusted under 35 U.S.C. 154(b) by 0 days.

(21) Appl. No.: 12/969,424

(22) Filed: Dec. 15, 2010

(65) Prior Publication Data

US 2011/0084726 A1  Apr. 14, 2011

Related U.S. Application Data

(62) Division of application No. 11/944,488, filed on Nov. 23, 2007, now Pat. No. 7,880,498.

(51) Int. Cl.
*H03K 19/173* (2006.01)
*H03K 19/00* (2006.01)

(52) U.S. Cl. ................... 326/38; 326/16; 326/46
(58) Field of Classification Search ............ 326/38
See application file for complete search history.

(56) References Cited

U.S. PATENT DOCUMENTS 6,819,157 B2 * 11/2004 Cao et al. ............... 327/262
2002/0178427 A1 * 11/2002 Ding et al. .............. 716/12
* cited by examiner

*Primary Examiner* — Rexford N Barnie
*Assistant Examiner* — Thienvu V Tran
(74) *Attorney, Agent, or Firm* — Cochran Freund & Young LLC

(57) ABSTRACT

A method and apparatus are provided for storing a value in a process register of an electrical circuit, which indicates a strength of a process in which the circuit was fabricated, and adjusting an input delay applied to data signals received by a synchronous storage element of the electrical circuit based on the stored value.

18 Claims, 4 Drawing Sheets

ADJUSTABLE HOLD FLIP FLOP AND METHOD FOR ADJUSTING HOLD REQUIREMENTS

CROSS-REFERENCE TO RELATED APPLICATION

This application is a divisional application of U.S. patent application Ser. No. 11/944,488, filed Nov. 23, 2007, by Stephan Habel, entitled "Adjustable Hold Flip Flop and Method for Adjusting Hold Requirements, the entire content of which is specifically incorporated herein by reference for all that it discloses and teaches.

FIELD OF THE DISCLOSURE

The present disclosure relates to semiconductor integrated circuits and other electronic circuitry. More particularly, the present disclosure relates to designing electrical components to meet timing requirements over changes in process, voltage and/or temperature (PVT). For example, the present disclosure relates to meeting timing requirements in critical paths for best case and worst case process conditions.

BACKGROUND

The design of semiconductor integrated circuits and other electrical circuit components involves not only verifying that the circuit functions as intended but that the design also meets any timing requirements for the technology in which the circuits are fabricated.

Static timing analysis is a common method for finding problem areas in an integrated circuit in the design phase. The circuit is simulated to determine if it meets the desired functionality both in terms of logic and timing. A static timing analysis may check a number of different timing requirements for inputs and/or outputs. For example, a setup time requirement is the required time duration that a data signal is required to be available at the input of a cell before a clock signal transition. A hold time requirement is the time duration that a data signal is required to be stable after the clock signal transition.

Generally, static timing analysis can be run for several corner cases, such as high and low temperature, high and low voltages, and best and worst case process conditions. For a "best case process" condition, a particular signal path on the integrated circuit will have a minimum propagation delay. For a "worst case process" condition, the signal path will have a maximum propagation delay.

When a circuit is designed to operate at clock speeds near the edge of what a particular technology can support, it becomes more difficult to meet both the best case process corner and the worst case process corner. For example, if a critical path meets the setup time requirement for a worst case process condition but fails the hold time requirement under a best case process condition, adding a delay to the critical path to correct the hold time violation may cause a violation of the worst case setup time requirement. Meeting timing requirements for both worst case paths and best case paths often results in a comprise by reducing the maximum clock speed and therefore reducing the maximum possible performance at one of the process corners.

Since the designer is not able to predict the actual process conditions for a particular device, the designer must therefore design the device to meet both process corners. In the alternative, individual devices can be screened based on performance after manufacture. Screening is generally used only as an exception and represents an expensive solution.

Since the actual process corners for a particular device are not known during development, prior to fabrication, improved methods and apparatus are desired for meeting timing requirements for both extremities of process conditions.

SUMMARY

An aspect of the disclosure relates to an integrated circuit including a process register adapted to store a value indicating a strength of a process in which the integrated circuit was fabricated. The integrated circuit further includes a logic circuit and an adjustable register connected to the logic circuit and having a data input, a data output, and a hold time adjustment input, which is controlled by the value stored in the process register. The adjustment input selects between a plurality of different input delays applied to signals received on the data input.

Another aspect of the disclosure relates to an integrated circuit including a process register adapted to store a value indicating a strength of a process in which the integrated circuit was fabricated, a logic circuit, a register coupled to the logic circuit and an adjustable buffer coupled between the logic circuit and the data input. The adjustable buffer has a buffer input, a buffer output, and a hold time adjustment input, which is controlled by the value stored in the process register and selects between a plurality of different propagation delays between the buffer input and the buffer output.

Another aspect of the disclosure relates to a method. The method includes: storing a value in a process register of an electrical circuit, which indicates a strength of a process in which the circuit was fabricated, and adjusting an input delay applied to data signals received by a synchronous storage element of the electrical circuit based on the stored value.

DETAILED DESCRIPTION OF ILLUSTRATIVE EMBODIMENTS

Process deviations during fabrication result in the production of semiconductor devices, which exhibit a wide range of characteristics. If a particular device exhibits "strong" characteristics (such as low output intendance, high drive current and faster speed), the process used to fabricate the particular semiconductor device will be referred to a "strong process". On the other hand, devices exhibiting "weak" characteristics (such as high output impedance, low drive currents and slower speeds) are frequently described as being fabricated using a "weak process". In one example, a "best case process" refers to a process corner representing a strongest process condition, whereas a "worst case process" refers to a process corner representing a weakest process condition. In other examples, however, the terms "best case process" and "worst case process" simply refer to process conditions that are stronger or weaker than respective "worst case process" and "best case process" conditions.

In an illustrative example of the present disclosure, a semiconductor integrated circuit is provided with one or more components that have adjustable hold time requirements. Depending on the strength of the process that was used to fabricate the particular integrated circuit, the hold times for the adjustable components can be adjusted to meet more easily the relevant timing requirements. Although the actual process conditions used to fabricate a particular device are not known at the time of development during which static timing analysis is performed, components having adjustable hold times may allow a design to meet timing requirements for both "best case process" and "worst case process" conditions. This may be helpful when a particular design is intended to operate at or near the performance limits of a given technology.

Figure 1:
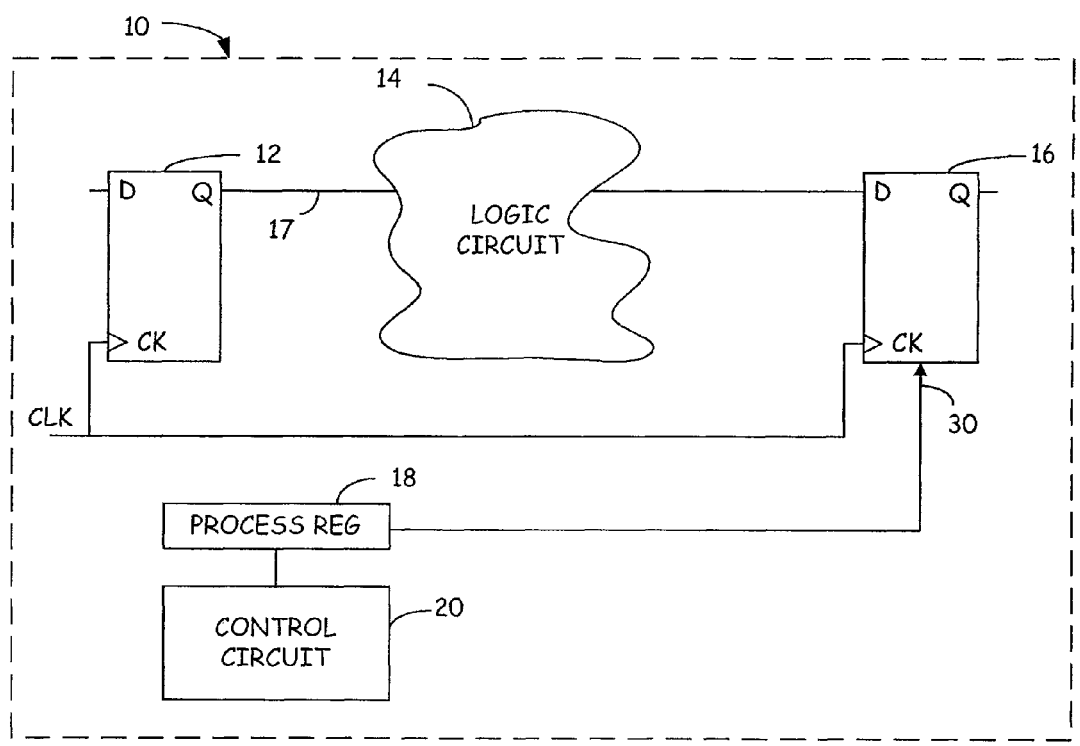
FIG. 1 is a diagram illustrating an example of an integrated circuit having a register with an adjustable hold time.

FIG. 1 is a block diagram illustrating an example of a semiconductor integrated circuit 10 having a register (such as a flip-flop) with an adjustable hold timing. Integrated circuit 10 includes a logic core having, for example, a data register 12, a logic circuit 14, a data register 16, a process register 18 and a control circuit 20. Data registers 12 and 16 each includes a data input "D", an data output "Q" and a clock input "CK". Each of the registers 12 and 16 latches the data applied to data input D to data output Q upon a transition in the clock signal CLK that is applied to clock input CK. In this example, the data output Q of register 12 is coupled to the data input D of register 16 along a path 17 through logic circuit 14. The data input of register 12 and the data output of register 16 can also be coupled to logic circuit 14 or to the overall logic circuit in which path 17 resides on integrated circuit 10.

The data signals received at data input D of register 16 must satisfy setup and hold timing requirements for the particular technology in which integrated circuit 10 is fabricated. The setup time is the time duration that the data signal is required to be available at input D before clock signal CLK transitions to latch the signal in register 16. The hold time is the time duration that the data signal is required to be stable at data input D of register 16 after the clock signal transition.

When designing integrated circuit 10 to perform at clock speeds at or near the edge at which the particular technology can support, it can become difficult to meet both the setup and hold timing requirements for a particular path on the integrated circuit. For example, if the integrated circuit 10 is fabricated with a "strong process", individual semiconductor devices along the path can have low output impedance, high drive currents and smaller propagation delays. Therefore, a data transition on output Q of register 12 due to a clock transition may violate a hold time requirement at data input D of register 16 since the data transition may propagate through logic circuit 14 before the previous data value has been latched by register 16.

If integrated circuit 10 is fabricated with a "weak process" the semiconductors on integrated circuit 10 may exhibit "weak" characteristics such as high output impedance, low drive currents and larger propagation delays. Therefore, a data transition on output Q of register 12 may not reach data input D of register 16 so that it becomes stable early enough before the next clock transition to satisfy the setup requirement.

During the design phase and prior to fabrication, it is common to perform static timing analysis on all signal paths to correct any setup or hold violations. The typical solution to a hold violation along a path, such as path 17 in FIG. 1, is to insert a delay element into the path in order to delay the change of data at the data input D of register 16. The typical solution to a setup violation along a critical path is to restructure the logic circuit 14 and/or path 17 to remove delay from the path.

However a difficulty arises due to the fact that during development the actual strength of the process is not known and therefore the designer must make the design satisfy both extremities of the process conditions. As explained above, in certain designs, adding a delay to cure a hold time violation may create a new setup time violation along the same path or a different path. Likewise, removing delay to cure a setup time violation may create a new hold time violation.

In order to provide flexibility such that a particular critical path need not satisfy static timing analysis for both extremities of the process conditions, the critical path can be modified during the design phase to replace a standard register on the path with an adjustable register, which has an adjustable input delay.

For example, if the initial design of integrated circuit 10 included typical registers 12 and 16 and static timing analysis identifies path 17 as a critical path, register 16 can be replaced with a special adjustable register (as shown in FIG. 1) having an adjustable input delay. The propagation delay from the data input D to the latch within register 16 is adjustable as a function of delay control input 30. The input delay can then be selected through control input 30 after integrated circuit 10 has been fabricated and the actual process conditions and their affects on integrated circuit 10 of fabrication are known.

In one example, delay control input 30 selects between a plurality of different input delays applied to signals received at data input D of register 16. For example, register 16 can include a plurality of delay elements, which are selectively coupled between data input D and the latch within register 16 as a function of the delay control input 30. The delay can also be adjusted in other ways, such as controlling current sources of elements along path 17 and/or in register 16.

In the example shown in FIG. 1, delay control input 30 is controlled by a value "Process_Adjust" stored in a storage element on integrated circuit 17, such a process register 18. The bit or bits of the value stored in process register 18 can directly control input 30 or can be decoded or otherwise modified to control input 30. Also, the bits can be buffered, enabled and disabled, and/or passed through any additional logic or control if desired.

Process register 18 stores a value representative of a strength (for example) of the process in which integrated circuit 10 was fabricated. Process register 18 can include any suitable number of bits and can identify any number of different process strengths. In one example, process register 18 identifies one of three different process strengths, including a strong process, a weak process and a normal process. However, process register 18 can be adapted to store a value selected from any number of two or more process strengths to provide a desired adjustment resolution.

Integrated circuit 10 can further include a control circuit 20, which controls the loading of process register 18 and the application of the stored value Process_Adjust to adjustable hold input 30 of register 16. For example, control circuit 20 can be used to control the time or times at which the value stored in process 18 is updated and the time or times at which that value is applied to the delay control input 30.

The value can be loaded in any manner, such as through input pins from a source external from integrated circuit 10 or from a source internal to integrated circuit 16. For example, process register 18 can be loaded under control of firmware and/or software associated with integrated circuit 10. Other methods of loading process register 18 can also be used. The value can be loaded at any time, such as during a power-on reset.

In one example, control circuit 20 includes an on-chip process monitor, which identifies the relative strength and weakness of the devices fabricated on integrated circuit 10 and thus of the processes used to fabricate the devices. For example, dedicated process monitor circuitry can be included on the silicon used to fabricate the semiconductor device, which includes a long chain of linked elements. Delay of an electrical signal across the dedicated process monitors circuitry can be measured and compared with the results provided by other process monitors from other semiconductor devices, or with data from computer simulations.

An example of a process monitor is disclosed in U.S. Pat. No. 5,654,859 and is assigned to LSI Corporation of Milpitas, Calif. This process monitor uses an existing impedance controller on an integrated circuit to eliminate the waste of silicon area normally required for other dedicated process monitor circuitry. Other types on on-chip process monitors can also be used.

The process monitor can include a basic monitor that requires control and interpretation external to integrated circuit 10 or can include a more sophisticated process monitor that is capable of automatically measuring the characteristics of the semiconductor devices and providing "a value" that can be loaded into the process register 18 and used to identify the process strength and control adjustment of register 16 without external interpretation, for example.

Figure 2:
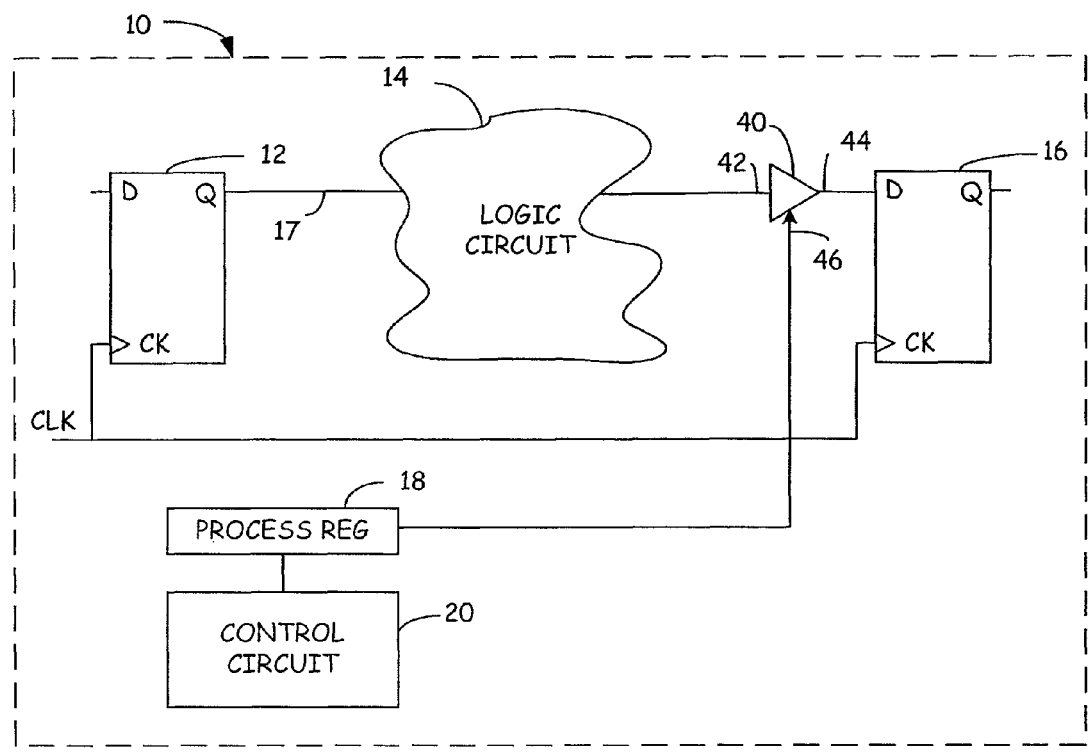
FIG. 2 is a diagram illustrating an example of an integrated circuit having a buffer with an adjustable hold time.

FIG. 2 is a diagram illustrating an example in which integrated circuit 10 includes an adjustable delay that is external to register 16. In this example, the initial design of integrated circuit 10, which comprises register 12, logic circuit 14 and register 16, is modified to further include an adjustable buffer 40. Registers 12 and 16 are non-adjustable, for example. Adjustable buffer 40 includes a buffer input 42, a buffer output 44 and a delay control input 46, which adjusts a hold time for register 16. In an example, the value stored in process register 18 controls input 46 such that buffer 40 selects between a plurality of different propagation delays between the buffer input and the buffer output. For example, adjustable buffer 40 can include a plurality of delay elements, which are selectively coupled between the buffer input and the buffer output as a function of the hold time adjustment input. Any other method or apparatus for adjusting the propagation delay be used in other examples.

Buffer 40 can be configured as a non-inverting buffer, an inverting buffer, and/or as any other suitable logic element or gate, including but not limited to an AND gate, a NAND gate, an OR gate and a NOR gate.

In the embodiments shown in FIGS. 1 and 2, process register 18 is loaded with a value representing the particular process condition in which integrated circuit 10 was fabricated. In an example in which integrated circuit 10 is fabricated with a "weak process", process register 18 can be set to indicate the weak process. The Process_Adjust signal will therefore select a small delay, such as a minimum delay, at data input D representing a minimum hold requirement, for example.

If the value stored in process register 18 indicates integrated circuit 10 was fabricated with a "strong process", the Process_Adjust signal will therefore select a large delay, such as a maximum delay, at data input D representing a maximum hold requirement, for example. The large delay is greater than the small delay.

If process register 18 indicates that integrated circuit 10 was fabricated with a "normal process" then the Process_Adjust signal will select a normal delay at data input D, which is between the small delay and the large delay.

As a result, an appropriate additional delay can be applied to the data input that is sufficient to fix a hold time violation (such as when the IC is in a best-case process corner). However, the additional delay is less likely to cause a new setup time violation (determined by the worst case process corner), since the added delay is only used in a circuit that is fabricated in a best-case process.

When a core design is implemented in a particular technology, the performance limit for that technology is defined by a combination of both the worst-case and best-case process corners. However when an adjustable register or buffer is used on critical paths, such as shown in FIG. 1 or 2, wherein different delays can be selected according to the actual process strength, the maximum performance can be defined by the longest path setup time in the worst-case process corner, for example.

The hold time adjustment can be added to integrated circuit with a minimal impact on routing congestion and timing. The Process_Adjust signal bus, would typically not be timing critical since the value on the bus is typically static. Further, the impact on routing congestion can be minimized since the hold time adjustment may be limited, if desired, to only those paths in the integrated circuit that are identified as being critical paths.

Figure 3:
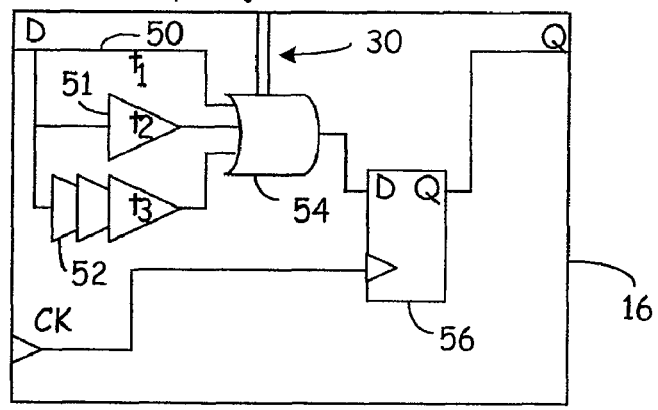
FIG. 3 is a diagram illustrating an adjustable register in greater detail according to an example of the disclosure.

FIG. 3 is a diagram illustrating an example of adjustable register 16 in greater detail. In this example, register 16 includes a plurality of delay paths 50-52, a multiplexer 54 and a latch (in this case a D-type flip-flop) 56. Delay path 50 has a relatively small propagation delay t1, delay path 52 has a relatively large propagation delay t3, and delay path 51 has a propagation delay t2 that is between t1 and t3. Multiplexer 54 connects data input D of register 16 to the data input D of latch 56 through a selected one of the delay paths 50-51. Multiplexer 54 selects a particular delay path as a function of the Process_Adjust select signal. In this example, Process_Adjust is a two-bit signal, which is labeled with the signal name "p_adj_sel[1:0]" to indicate the two bits.

The propagation delays through each of the paths can be achieved by placing an appropriate number of buffers in series with one another, as shown in paths 51 and 52. Path 50 has no additional buffers and therefore has the least delay. In one example, if process register 18 has a value indicating a "weak process", the Process_Adjust signal and multiplexer 54 will therefore select delay path 50 having the smallest delay, t1. If the value stored in process register 18 indicates a "strong process", the Process_Adjust signal and multiplexer 54 will select delay path 52 having the largest delay, t3, in order to make sure the hold time requirement is satisfied. If the value stored in process register 18 indicates a "normal process", the Process_Adjust signal and multiplexer 54 will select delay path 51 having a delay t2 that is between t1 and t3. Other arrangements can also be used.

Figure 4A:
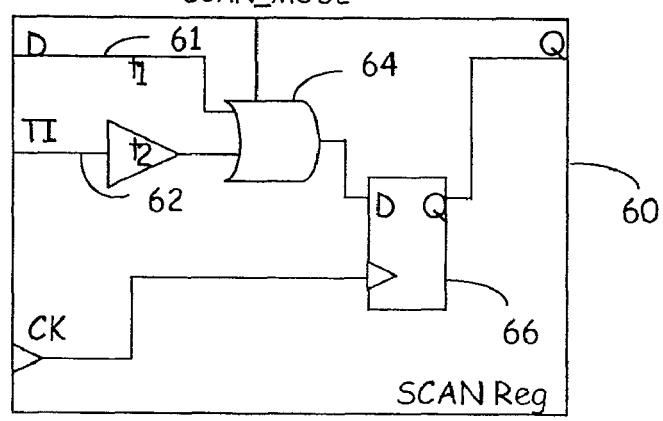
FIG. 4 is a diagram illustrating a scannable register that can be modified to function as an adjustable hold register according to an example of the disclosure.

FIG. 4A is a diagram that illustrates a scannable register 60 that can be modified to implement a register that also has an adjustable hold time. Scannable register 60 has a normal data input path 61 coupled to data input "D", a test data input path 62 coupled to scan-in test data input "TI", a multiplexer 64 and a latch 66. Multiplexer 64 selects data from either the normal data input D or the test data input TI as a function of the scan mode input Scan_Mode. test data input path 62 can have a delay buffer that adds a delay t2 to ensure that the test scan chain satisfies hold requirements for IC manufacture with strong processes.

Figure 4B:
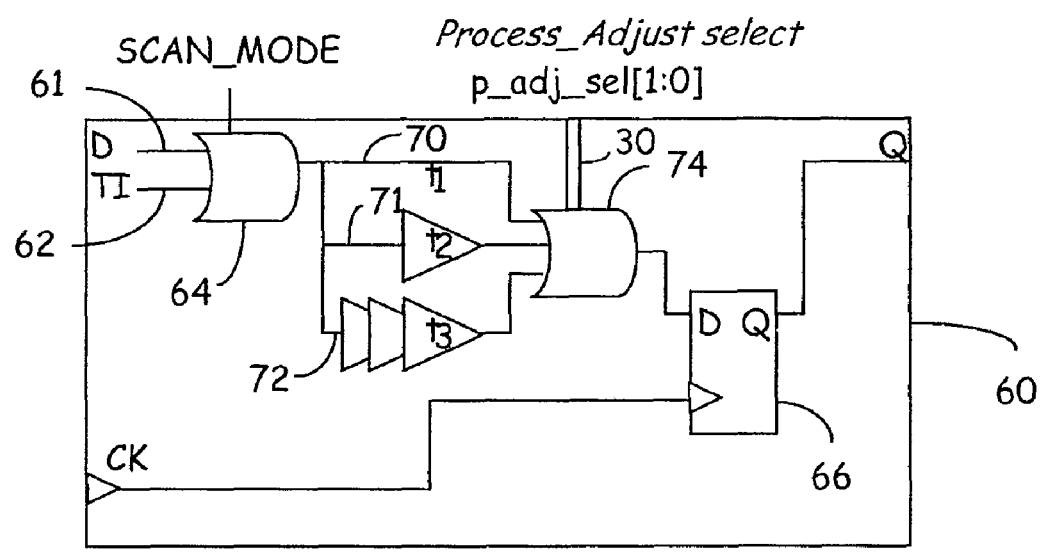

FIG. 4B illustrates scannable register 60 after being modified to implement a register that also has an adjustable hold time. The same reference numerals are used in FIG. 4B as were used in FIG. 4A for the same or similar elements. Register 60 retains the normal data input D, the test data input TI and scan mode multiplexer 64. However, register 60 is modified to include adjustable hold-time delay paths 70-72 and process-adjust multiplexer 74, which are similar to paths 50-52 and multiplexer 54 in FIG. 3. The buffers that provide delay t2 were pre-existing in register 60 but have been moved from path 62 to path 71 to perform part the hold-time adjustment function. When Scan_Mode is active, the Process_Adjust input 30 can be controlled to select, for example, delay path 71 (having delay t2) similar to the delay t2 shown in FIG. 4A. In another embodiment, register 60 includes further logic that combines the scan_mode input and the Process_Adjust input to make the desired selection through multiplexer 74.

Although the present disclosure has been described with reference to one or more examples, workers skilled in the art will recognize that changes may be made in form and detail without departing from the scope of the disclosure and/or the appended claims. For example, and not by limitation, hold time adjustments such as those described herein can be used to adjust hold time at the input to any synchronous element, such as a clocked register or other storage element on an integrated or non-integrated electronic circuit.

What is claimed is:

1. An integrated circuit comprising:
   a process register fabricated on the integrated circuit adapted to store a value indicating a strength of a fabrication process in which the integrated circuit was fabricated, the process adjust value not indicating a current operating temperature of the integrated circuit and not indicating a current operating voltage of the integrated circuit;
   a logic circuit fabricated on the integrated circuit;
   an adjustable register fabricated on the integrated circuit and connected to the logic circuit and comprising a data input, a data output, and a clock input;
   an adjustable buffer coupled between the logic circuit and the data input and comprising a buffer input, a buffer output, and a hold time adjustment input, which is controlled by the value stored in the process register and selects between a plurality of different propagation delays between the buffer input and the buffer output; and
   a control circuit fabricated on the integrated circuit and comprising a process monitor, which measures characteristics of semiconductor devices on the integrated circuit and loads the process adjust value into the process register that identifies the strength of the process with which the integrated circuit was fabricated.

2. The integrated circuit of claim 1, wherein:
   the process register has an output that is electrically coupled to the hold time adjustment input.

3. The integrated circuit of claim 1, wherein the adjustable buffer comprises:
   a plurality of delay elements, which are selectively coupled between the buffer input and the buffer output as a function of the hold time adjustment input.

4. The integrated circuit of claim 1, wherein:
   the process register stores a value selected from the group comprising a first value representing a strong fabrication process, a second value representing a weak fabrication process and a third value representing a normal fabrication process; and the different propagation delays comprise a strong delay, a weak delay, which is smaller than the strong delay, and a normal delay, which is between the strong delay and the weak delay; and
the hold time adjustment input selects between the strong, weak and normal delays.

5. The integrated circuit of claim 4, wherein:
the process register stores a value selected from the group consisting of the first value representing the strong fabrication process, the second value representing the weak fabrication process and the third value representing the normal fabrication process; and
the different propagation delays consist of the strong delay, the weak delay, and the normal delay.

6. The integrated circuit of claim 1, wherein the value is loaded using input pins from a source external from integrated circuit.

7. The integrated circuit of claim 1, wherein the value is loaded from a source internal to integrated circuit.

8. The integrated circuit of claim 1, wherein the value is loaded under control of software associated with integrated circuit.

9. The integrated circuit of claim 1, wherein the value is loaded during a power-on reset.

10. A method comprising:
    storing a process adjust value in a process register on an integrated circuit chip, the process adjust value solely indicating a strength of a fabrication process in which the integrated circuit chip was fabricated, the process adjust value not indicating a current operating temperature of the integrated circuit and not indicating a current operating voltage of the integrated circuit;
    adjusting a propagation delay of a buffer fabricated on the same integrated circuit chip based on the stored process adjust value;
    measuring characteristics of semiconductor devices on the integrated circuit chip with a process monitor that is fabricated on the integrated circuit chip to obtain the process adjust value that identifies the strength of the process with which the integrated circuit chip was fabricated; and
    loading the process adjust value into the process register.

11. The method of claim 10, wherein adjusting a propagation delay comprises:
    selecting between a plurality of predefined, discrete propagation delays.

12. The method of claim 11, wherein adjusting a propagation delay comprises:
    controlling a propagation delay adjustment input to the buffer, which selects between the plurality of predefined, discrete propagation delays.

13. The method of claim 12, wherein the buffer comprises a data input and a data output and wherein adjusting a propagation delay further comprises:
    selectively coupling at least one of a plurality of different delay elements between the data input and the data output as a function of the propagation delay adjustment.

14. The method of claim 10, wherein:
    storing said process adjust value comprises storing in the process register a value selected from the group comprising a first value representing a strong fabrication process, a second value representing a weak fabrication process and a third value representing a normal fabrication process; and the step of adjusting comprises selecting between a strong delay, a weak delay, which is smaller than the strong delay, and a normal delay, which is between the strong delay and the weak delay.

15. The method of claim 10, wherein the process register is loaded using input pins from a source external from integrated circuit.

16. The method of claim 10, wherein the process register is loaded from a source internal to integrated circuit.

17. The method of claim 10, wherein the process register is loaded under control of software associated with integrated circuit.

18. The method of claim 10, wherein the process register is loaded during a power-on reset.

* * * * *